United States Patent
Schäfer

(10) Patent No.: US 6,476,658 B2
(45) Date of Patent: Nov. 5, 2002

(54) CIRCUIT CONFIGURATION WITH PROTECTION DEVICE

(75) Inventor: Andre Schäfer, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/847,673

(22) Filed: May 2, 2001

(65) Prior Publication Data
US 2001/0040476 A1 Nov. 15, 2001

(30) Foreign Application Priority Data
May 2, 2000 (DE) .......................... 100 21 371

(51) Int. Cl.$^7$ ................................ H03K 5/08
(52) U.S. Cl. ........................................ 327/318
(58) Field of Search ................ 326/30; 327/309, 327/318, 319, 333, 538, 543

(56) References Cited

U.S. PATENT DOCUMENTS 5,726,582 A * 3/1998 Hedberg .................. 326/21
6,288,564 B1 * 9/2001 Hedberg .................. 326/21
6,297,663 B1 * 10/2001 Matsuoka et al. ........ 326/30

FOREIGN PATENT DOCUMENTS

DE 19735982 C2 4/2000
EP 0872961 A1 10/1998

* cited by examiner

Primary Examiner—Jeffrey Zweizig
(74) Attorney, Agent, or Firm—Laurence A. Greenberg; Werner H. Stemer; Ralph E. Locher

(57) ABSTRACT

The circuit configuration, in particular a DRAM element, has a protection device for suppressing the formation and/or emission of a reflection signal caused by a received supply input signal. An active signal matching device is provided, with which it is possible to prevent the formation of a reflection signal by using the input signal.

16 Claims, 4 Drawing Sheets

CIRCUIT CONFIGURATION WITH PROTECTION DEVICE

BACKGROUND OF THE INVENTION

Field of the Invention

The invention relates to a circuit configuration such as, for example, a memory device, in particular DRAM element, or the like. The circuit has at least one input region which is configured to receive a supplied electrical input signal and which, for this purpose, has at least one input line device. A protection device is provided in the input region and is configured at least for partial suppression of the formation and/or emission of a reflection signal caused by a received supplied input signal—in particular on the input line device.

In many electrical systems and circuit configurations, specific signals are transmitted from parts of the system, for example, what are referred to as drivers, and are provided and transmitted to other parts of the system referred to as receivers. A problem in electrical systems, circuit configurations, for example memory devices and in particular DRAM elements, is in this case that, in many cases—in particular if the input impedance is designed to be high and mainly capacitive—the characteristic impedance of the input region of such an electrical system or of a circuit configuration is at least partially and often even totally reflective for a signal edge or a voltage edge arriving in the input region of this system or circuit configuration. The reflected signal or reflection signal then passes out of the input region of the receiving circuit configuration, and back toward the transmitting unit. There, and/or furthermore, the reflection signal can lead to a malfunction and thus, overall, to an entire malfunction of the electrical system.

In prior art circuit configurations, particularly in the case of memory devices, in particular DRAM elements, as well, a wide range of measures have therefore been proposed in order to suppress the formation and/or the emission of reflection signals caused by input signals.

For example, protection devices have been proposed which are matched to the specific input/characteristic impedance of the input region of the circuit configuration and, with respect to the specific characteristic impedance of the input region, lead to at least partial suppression of a reflection signal.

Prior art protection devices of such a type in circuit configurations provide, for example, series resistors for attenuating the returning reflection signal. These attenuate firstly the forward wave and secondly, after reflection, also the reverse wave, and thus the amount of power transported back.

Another conventional measure for protection against reflection signals is the provision of a concentrated resistance connected in parallel in the input region of the circuit configuration, with the value of the resistance being chosen such that it matches the characteristic impedance, and which allows a high level of suppression of the formation and emission of a reflection signal to be achieved.

A disadvantage of these prior art circuit configurations and of the protection devices provided in them is that, for partial suppression of the formation and/or emission of reflection signals, this respective protection device is always matched to the specific value of the characteristic impedance in the input region of the circuit configuration. In this case, a particular disadvantage is that, if this characteristic impedance changes, the corresponding protection device can no longer be adjusted to the changed conditions, and protection can no longer be adequately ensured. Such changes to the characteristic impedance in the input region of known circuit configurations occur, for example, in conjunction with variations in the course of the production process for the circuit configuration, or else from interaction with electrical systems downstream from the circuit configuration.

SUMMARY OF THE INVENTION

The object of the present invention is to provide a circuit configuration such as, for example, a memory device and in particular a DRAM element or the like, which overcomes the above-noted deficiencies and disadvantages of the prior art devices and methods of this general kind, and in which the formation and/or emission of a reflection signal caused by received supplied input signals can be suppressed in a particularly simple but nonetheless reliable and flexible manner.

With the above and other objects in view there is provided, in accordance with the invention, a circuit configuration, for example a memory device such as, for example, a DRAM element, comprising:
an input line device;
an input region connected to the input line device for receiving via the input line device an electrical input signal;
a protection device in the input region for at least partially suppressing one of a formation and an emission of a reflection signal caused by the electrical input signal; and
the protection device having an active compensation device configured to generate and superimpose a compensation signal on a reflection signal being formed.

In the circuit configuration of this generic type, for example a memory device and in particular a DRAM element or the like, there is at least one input region which is designed at least to receive a supplied electrical input signal and which, for this purpose, has at least one input line device. Furthermore, a protection device is provided, which is formed at the input region and is designed at least for partial suppression of the formation and/or emission of a reflection signal caused by a received supplied input signal, in particular on the input line device.

In accordance with the invention, the protection device of the circuit configuration has an active compensation device, by means of which a compensation signal can be generated and/or can be superimposed on a reflection signal which is formed and/or emitted.

One basic idea of the present invention is that, instead of using passive reflection suppression, to at least partially compensate for any reflection signal that is produced, and/or for the emission of any reflection signal which has already been produced, by suitable superimposition, that is to say in particular by destructive interference, using a compensation signal. While passive protection measures which cannot be altered once selected, for example, fixed series resistors or constant concentrated parallel resistances, do not allow adaptation to changes in the boundary conditions since the selection of the components cannot be altered, the use, according to the invention, of an actively generated compensation signal offers the greatest possible flexibility for suppression of reflections, even when variations in the production conditions and/or other interacting circuit configurations downstream from the input region vary the apparent characteristic impedance, and hence the reflection behavior in the input region.

The basic idea of the present invention can also be achieved by carrying out active signal matching instead of passive reflection suppression, with the formation of a reflection signal resulting from use of the input signal being prevented or suppressed. This is achieved according to the invention by providing an active signal matching device, which actually provides for the use of the input signal and thus for the suppression or prevention of the formation of a reflection signal.

In the following text, the expression active compensation device, by means of which a compensation signal can be generated and can be superimposed on any reflection signal which is formed, should also always be understood as meaning an active signal matching device which prevents the formation of a reflection signal resulting from use of the input signal.

In this case, it is particularly advantageous for the compensation device to be designed such that it can be controlled, in particular, within a feedback control loop. This measure makes it possible, for example, for the actual formation and/or emission of a reflection signal to be monitored permanently or at given times via an appropriate sensor system in order for them to carry out appropriate matching of the compensation signal in terms of time and amplitude—if necessary instantaneously—when a specific threshold value is present in the reflection signal.

For this purpose, it is advantageous for an appropriate control device, to be provided for controlling the compensation device, in particular in the input region of the circuit configuration.

In order to control the compensation device, one preferred embodiment of the circuit configuration according to the invention provides for at least one controlled variable, in particular a voltage and/or a current to be supplied to the compensation device and/or to the control device, in particular from the input line device on which the reflected wave or the reflection signal would pass back to the unit which originally transmitted it.

In order to form the compensation signal, a further embodiment of the circuit configuration according to the invention provides at least one, in particular controllable, current source device, which may also be in the form of a current source amplification device. A corresponding current signal is thus generated in the current source device in response to a control signal, for superimposition on any reflection signal which is formed, and is provided, in particular, for the input line device.

In this case, it is particularly advantageous for the current source device to be designed for current generation and/or amplification which is matched to a given characteristic impedance, in particular of the input region of the circuit configuration, and which, in particular, satisfies the relationship $$1/g_m = Z_1 = U_{rec}/I_{source}$$

where $U_{rec}$ is the received electrical voltage at the input region, $I_{source}$ is the received electrical current in the input region, $Z_1$ is the input characteristic impedance in the input region, and $g_m$ is the current gain. This means that the generated and provided current signal from the current source device is precisely matched to the characteristic impedance of the input region at that time, so that any reflection signal which is formed can be suppressed particularly effectively. Such flexible matching of the suppression to a varying characteristic impedance in the input region of the circuit configuration would not be feasible with a hardwired and fixed conventional protection device. This represents a particular advantage of the process according to the invention.

In order to suppress and/or overcome a reflection signal particularly effectively, a further advantageous embodiment of the circuit configuration according to the invention provides for the control device to have a comparison device which is designed for comparing a supplied controlled variable with a predetermined reference variable and for generating and providing a comparison signal and/or a control signal, in particular to the compensation device.

The controlled variable which is supplied may in this case in particular be a value, measured in the input region and, in particular, in the input line device, of the electrical current which is present there at that time, or an electrical voltage. The reference variable would in this case correspond to a nominal value or threshold value for the electrical voltage or the electrical current which the reflected wave must not exceed in the input region.

The comparison to be carried out in the comparison device determines whether the corresponding threshold values have been exceeded. As a reaction to overshooting, an appropriate comparison signal and/or control signal is generated at that time and instantaneously and is emitted in particular to the compensation device, thus resulting in appropriate compensation for the reflection signal, likewise instantaneously.

In one particularly advantageous embodiment of the circuit configuration according to the invention, the compensation device has a number of current source devices, the control device has a register device, and the register device is designed for selecting and/or determining those current source devices which are active and/or are to be activated, and/or the respective current gains.

The number of current source devices which are provided allow particularly simple, flexible and rapid matching of the compensation signal to the reflection signal which is formed. In this case, those current source devices which are in each case active and/or are to be activated can be selected via the register device. It is thus possible to provide a number of current sources, which may also be identical, in the compensation device, for example by appropriate switches. One or more of these current sources, which are connected in parallel, is or are then activated depending on the intensity of the reflection signal which is formed, so that each individual current source generates and provides its individual contribution to the formation of the compensation signal and to its superimposition on the reflection signal. Alternatively, or additionally, it is feasible to use the register device to control the corresponding gain factors of the individual current sources as well, for example, via an appropriate gate/base voltage to be supplied, if the respective current sources are, for example, in the form of bipolar or field-effect transistors.

A further increase in the flexibility and reliability of the compensation for reflection signals is obtained if the comparison device and/or the register device are/is programmable, in particular externally. This is because it is possible to adapt the threshold values which, when exceeded lead to readjustment of the compensation behavior and of the compensation signal. Furthermore, a programmable register device can also be used to adapt and to optimize the behavior of the compensation device subsequently.

Other features which are considered as characteristic for the invention are set forth in the appended claims.

Although the invention is illustrated and described herein as embodied in a circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
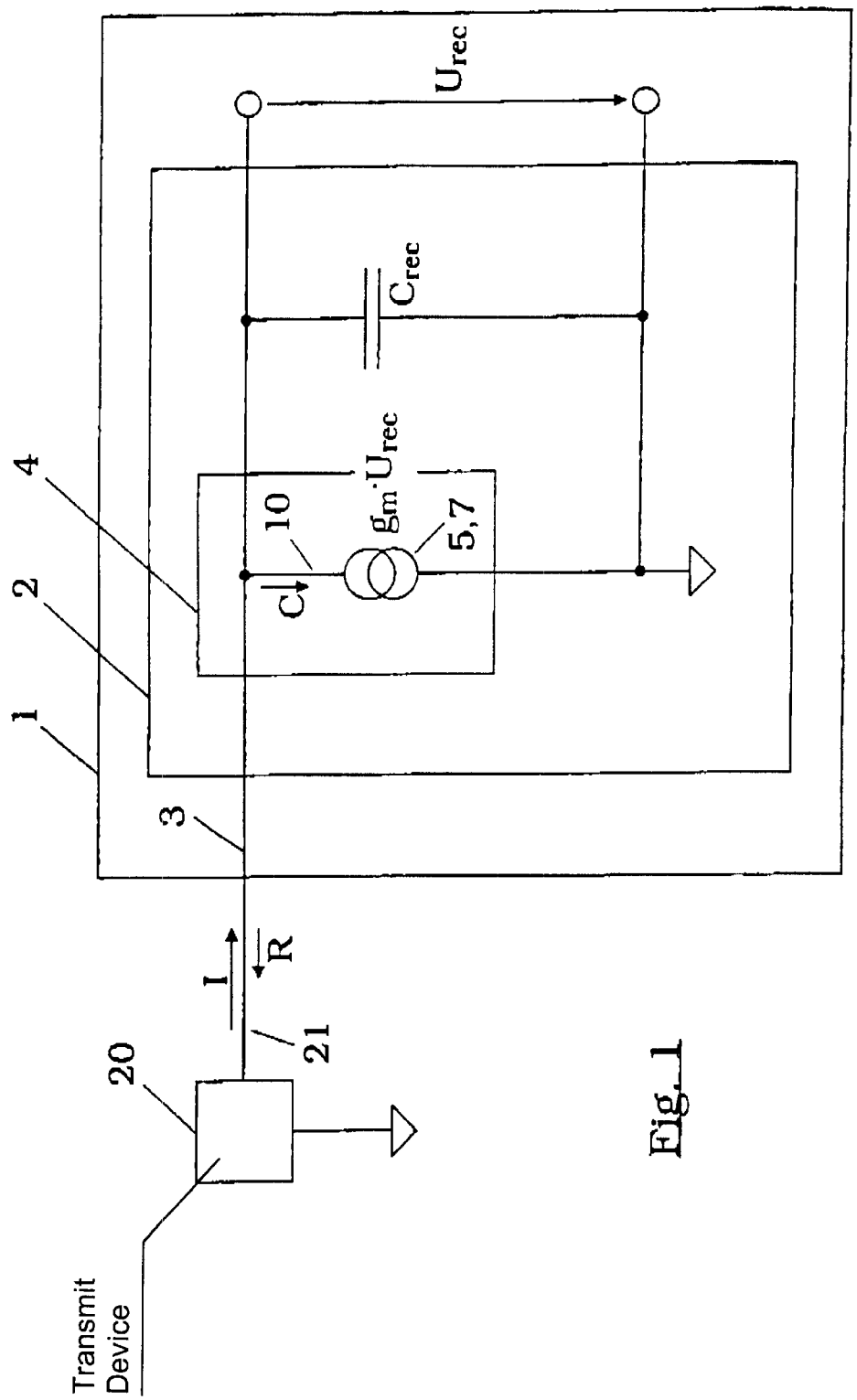
FIG. 1 is a block diagram of a first exemplary embodiment of the circuit configuration according to the invention.

Referring now to the figures of the drawing in detail and first, particularly, to FIG. 1 thereof, there is seen a first exemplary embodiment of the circuit configuration according to the invention illustrated in the form of a block diagram. An input region 2 of the circuit configuration is connected via an input line device 3 to an external transmitting device 20, and to its output line device 21, via which an input signal I is transmitted to the circuit configuration 1 according to the invention. The mismatch between an input capacitance $C_{rec}$ and the given characteristic impedance $Z_1$, in the input region 2, whose impedance is in this case high, of the circuit configuration 1, results in a reverse reflection signal R, which passes back via the input line device 3 to the output line device 21 of the transmitting unit 20.

A protection device 4 is provided in the input region 2 of the circuit configuration 1 and, via a compensation line 10 provides a compensation signal C, which is generated by a controlled current source device 7 used as the compensation device 5, to the input line device 3 in order to compensate for the reflection signal R which is formed. The arrow R, which is shorter than the arrow I by the arrow C, is intended to indicate this partial compensation.

Figure 2:
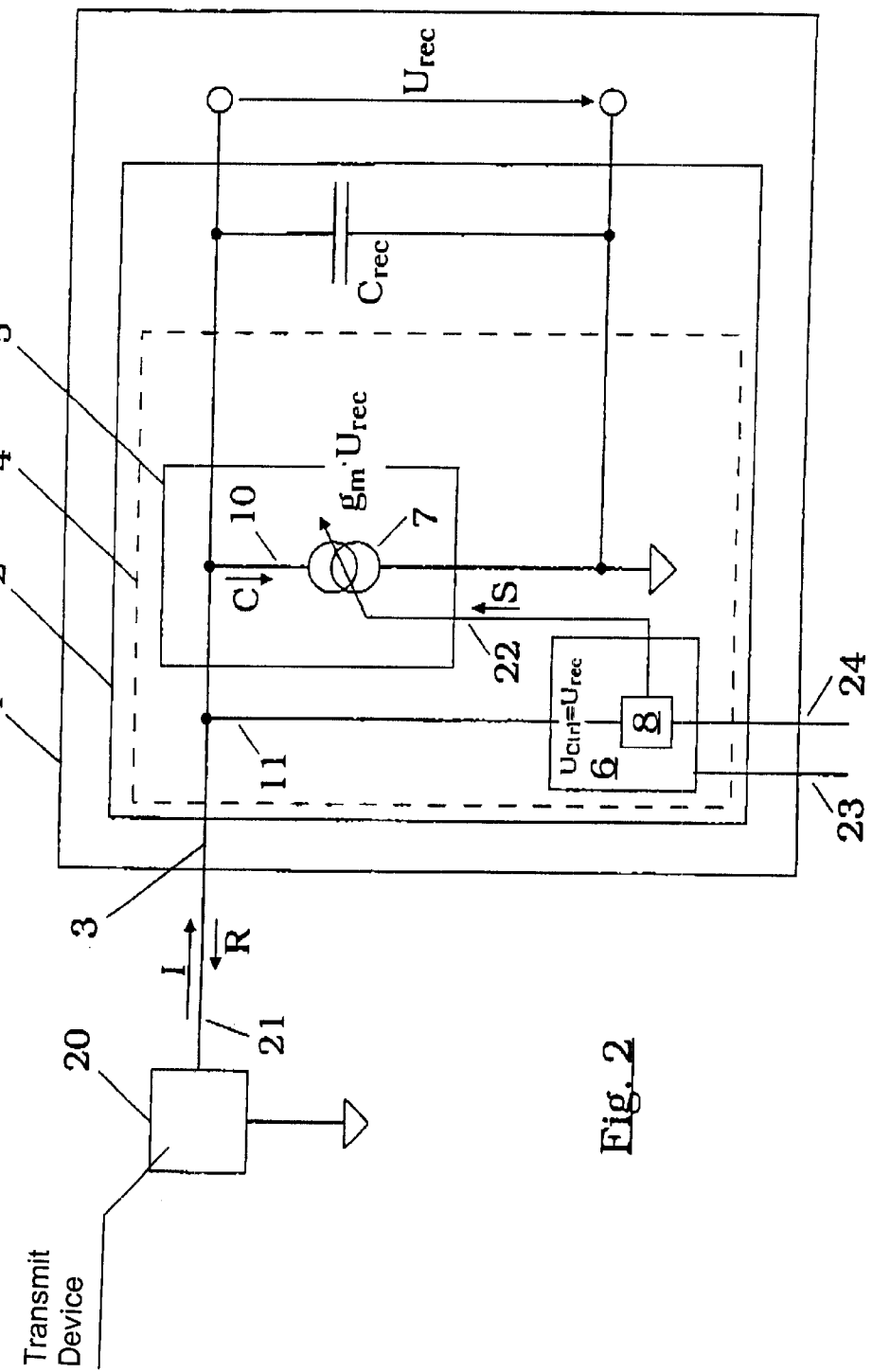
FIG. 2 is a block diagram illustrating a second exemplary embodiment of the circuit configuration according to the invention.

FIG. 2 shows a second exemplary embodiment of the circuit configuration 1 according to the invention, likewise in the form of block diagram.

The circuit configuration 1 once again receives an input signal I in its input region 2 on the input line device 3, which is once again connected to the output line device 21 of an externally transmitting unit 20. The input signal I leads to the formation of a partially compensated reflection signal R.

A protection device 4 with a compensation device 5 is formed in the input region 2 of the circuit configuration 1, with the compensation device 5 supplying a generated compensation signal C via a compensation line 10 to the input line device 3 in the input region 2. The compensation device 5 has a controllable current source device 7 or current source amplification device for generating and providing the compensation signal C. The current source device 7 or current source amplification device has a control signal S applied to it, via the control device 6, by means of a control line 22.

In the exemplary embodiment shown in FIG. 2, the control signal S is produced and provided in the control device 6 by sampling the reflection signal R of the input line device 3 by means of the sampling line 11 and the comparison device 8 in the control device 6.

The control device 6 and/or the comparison device 8 can be controlled via external control lines 23 and 24 respectively. In a particular embodiment, they are externally programmable.

Figure 3:
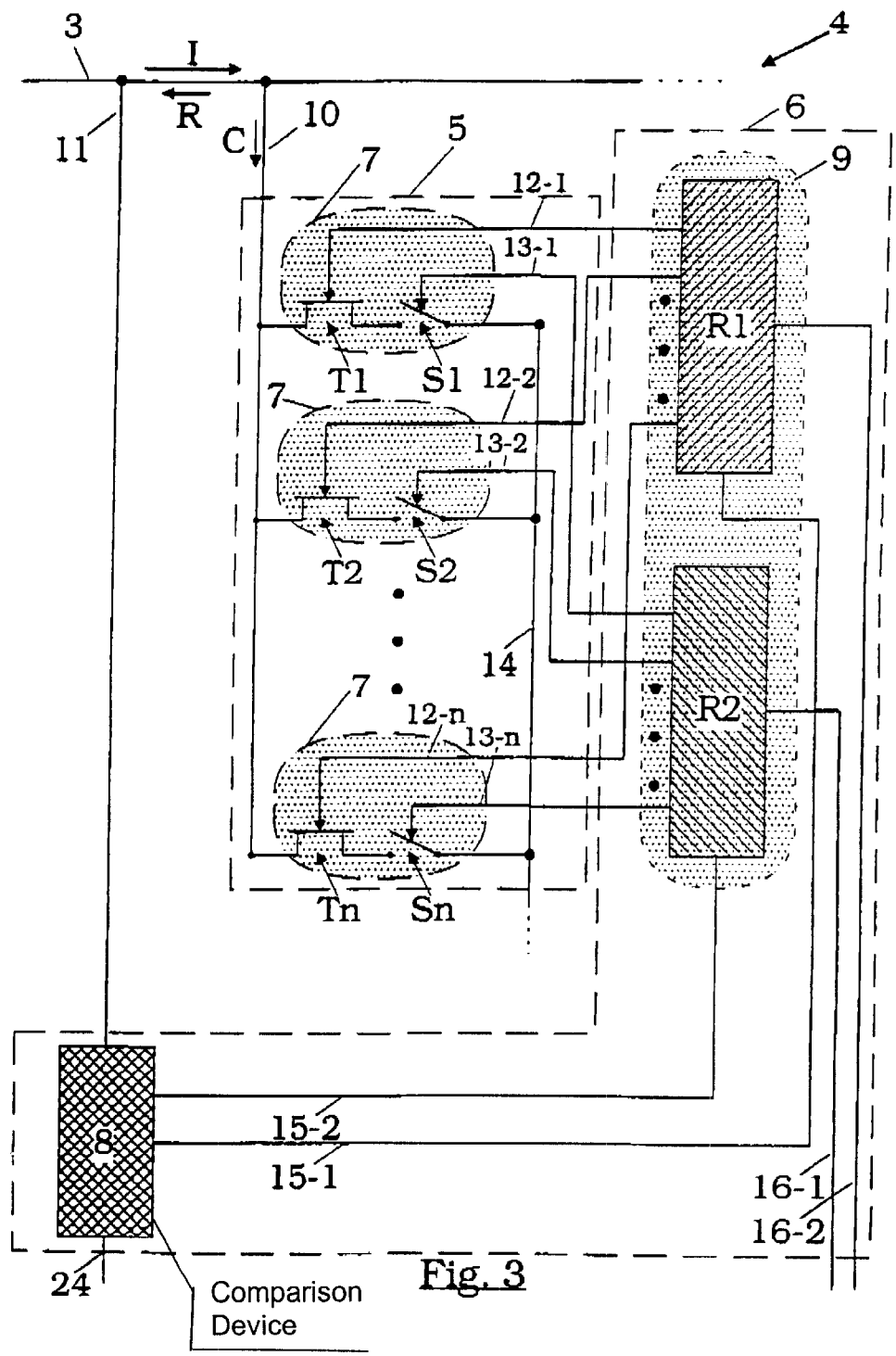
FIG. 3 is a schematic block diagram showing a compensation device in a third exemplary embodiment of the circuit configuration according to the invention.

Using a further block diagram, FIG. 3 shows a detailed view of a further embodiment of the circuit configuration 1 according to the invention, to be precise with respect to the protection device 4.

In this exemplary embodiment, a number n mutually independent current source devices 7 are provided. These are supplied via a common supply line 14 and are controlled via mutually isolated and independent current control lines 12–1, . . . , 12-n and switching lines 13–1, . . . , 13-n, which are likewise isolated from one another and are mutually independent, with regard to the current level to be produced and with regard to their switch-on state.

For this purpose, the transistor T1, . . . , Tn is in each case provided for current control in each of the current source devices 7, with the respective current control lines 12–1, . . . , 12-n acting as base lines. The switching state is in each case controlled via switching elements S1, . . . , Sn, which may likewise be in the form of transistors. The switching elements S1, . . . , Sn are respectively connected in series with the transistors T1, . . . , Tn.

Instead of the transistors T1, . . . , Tn entirely generic, in particular controlled, current source devices can be provided. In FIG. 3, the corresponding transistor symbols in the drawing figure would in that case need to be read as indicating a generic current source.

The respective contributions of the individual current source devices 7 are provided by connecting them in parallel via the compensation line 10 and the protection device 4.

A register device 9 is provided, which has a first register R1 and a second register R2, which are intended for controlling the current levels of the current source devices 7 via the current control lines 12–1, . . . , 12-n, and for controlling the switch-on state of the current source devices 7 via the switching lines 13–1, . . . , 13-n.

The registers R1 and R2 in the register device 9 are arranged in the control device 6 and are connected controllably via bus lines 15–1, 15–2 and 16–1, 16–2 to the comparison device 8, to other circuit devices, and to the outside, respectively.

For its part, the comparison device 8 receives as the controlled variable the current and/or the voltage of the reflection signal R on the input line device 3 of the input region 2, via the sampling line 11, and then carries out an appropriate comparison operation with a predetermined reference or nominal variable which, if required, can be provided or varied via an external control line 24.

The register device 9 together with its registers R1, R2 can be used as what is referred to as a mode register and may be programmable—in particular externally.

Figure 4:
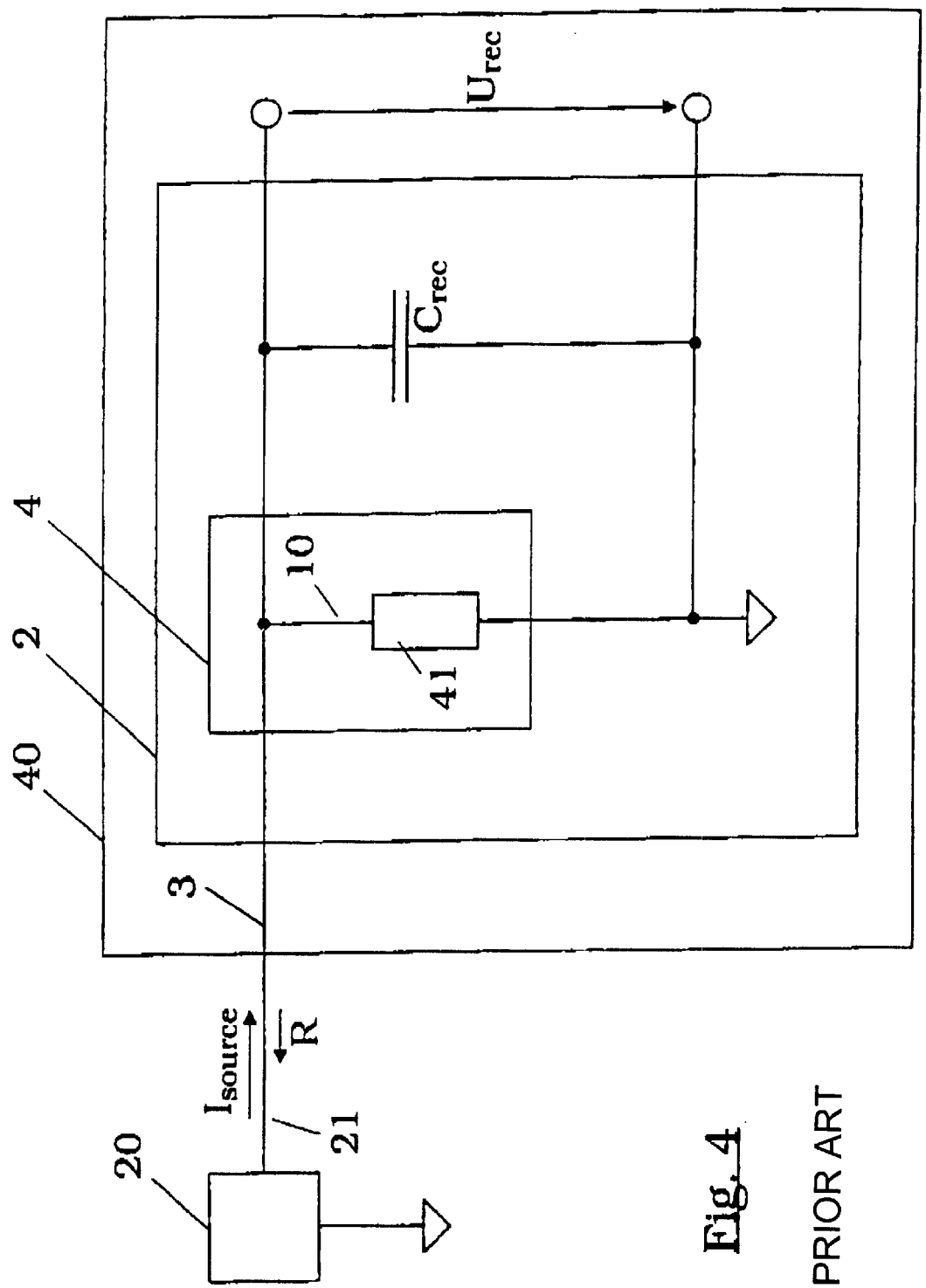
FIG. 4 is a block diagram of a corresponding prior art circuit configuration.

FIG. 4 shows a prior art circuit configuration 40, likewise in the form of a block diagram. There, a protection device 4 is provided in the input region 2 of the circuit configuration 40. The prior art protection device 4 consists solely of a passive, parallel-connected concentrated resistance 41 which is selected in conjunction with the input capacitance $C_{rec}$ of the input region 2 such that the reflection signal R formed because of the input signal $I_{source}$ received via the input line device 3 can be suppressed as well as possible for a given and fixed characteristic impedance $Z_1 = U_{rec}/I_{source}$.

I claim:

1. A circuit configuration, comprising:

an input line device;

an input region connected to said input one device for receiving via said input line device an electrical input signal;

a protection device in said input region for at least partially suppressing one of a formation and an emission of a reflection signal caused by the electrical input signal, said protection device having an active, controlled compensation device configured to generate and superimpose a compensation signal on the reflection signal being formed; and a control device connected to and controlling said compensation device, said control device being connected to receive at least one controlled variable selected from the group consisting of a voltage and a current, for controlling said compensation device, said control device being connected to said input line device for receiving therefrom the controlled variable.

2. The circuit configuration according to claim 1, wherein said compensation device is a feedback-regulated compensation device.

3. The circuit configuration according to claim 1, wherein said compensation device is connected to receive and is controlled by at least one controlled variable selected from the group consisting of a voltage and a current.

4. The circuit configuration according to claim 3, wherein said compensation device is connected to said input line device for receiving therefrom the controlled variable.

5. The circuit configuration according to claim 1, wherein said compensation device includes at least one current source device.

6. The circuit configuration according to claim 5, wherein said at least one current source device is a controllable current source device.

7. The current configuration according to claim 5, wherein said current source device is connected to and configured to provide an electrical current to said input line device.

8. The circuit configuration according to claim 5, wherein said current source device is one of a current generator and a current amplifier, having a current generation or amplification substantially corresponding to a given characteristic impedance and satisfying the relationship $$1/g_m = Z_1 = U_{rec}/I_{source}$$

where $U_{rec}$ is an electrical voltage received at said input region, $I_{source}$ is an electrical current received in said input region, $Z_1$ is the input characteristic impedance in said input region, and $g_m$ is a current gain of said current source device.

9. The circuit configuration according to claim 8, wherein the given characteristic impedance is the impedance of said input region.

10. The circuit configuration according to claim 1, wherein said control device includes a comparison device configured to compare a controlled variable supplied thereto with a predetermined reference variable and to generate and output one of a comparison signal and a control signal.

11. The circuit configuration according to claim 10, wherein said comparison device is connected to output the control signal to said compensation device.

12. The circuit configuration according to claim 1, wherein said compensation device had a plurality of current source devices;

said control device has a register device; and said register device is configured to select and to determine an activation of respective said current source devices.

13. The circuit configuration according to claim 12, wherein said register device is configured to set a current gain of said current source devices.

14. The circuit configuration according to claim 12, wherein at least one of said comparison device, said control device, and said register device are programmable devices.

15. The circuit configuration according to claim 10, wherein at least one of said comparison device and said control device are programmable devices.

16. The circuit configuration according to claim 1, wherein said input line device is an input of a memory device.

* * * * *